(12) United States Patent
Obara

(10) Patent No.: US 12,532,751 B2
(45) Date of Patent: Jan. 20, 2026

(54) SEMICONDUCTOR DEVICE AND METHOD OF MANUFACTURING SEMICONDUCTOR DEVICE

(71) Applicant: Mitsubishi Electric Corporation, Tokyo (JP)

(72) Inventor: Taichi Obara, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 442 days.

(21) Appl. No.: 18/150,662

(22) Filed: Jan. 5, 2023

(65) Prior Publication Data

US 2023/0317573 A1 Oct. 5, 2023

(30) Foreign Application Priority Data

Apr. 4, 2022 (JP) .................................. 2022-062232

(51) Int. Cl.
*H01L 23/495* (2006.01)
*H01L 23/13* (2006.01)
(Continued)

(52) U.S. Cl.
CPC ........ *H01L 23/49568* (2013.01); *H01L 23/13* (2013.01); *H01L 23/29* (2013.01); *H01L 23/367* (2013.01)

(58) Field of Classification Search
CPC ... H01L 23/49568; H01L 23/13; H01L 23/29; H01L 23/367; H01L 23/49551;
(Continued)

(56) References Cited

U.S. PATENT DOCUMENTS

2003/0180985 A1 9/2003 Katou et al.
2009/0215230 A1* 8/2009 Muto ...................... H01L 24/40
257/E21.502
(Continued)

FOREIGN PATENT DOCUMENTS

DE 10 2008 045 581 A1 9/2009
JP H1022435 A * 1/1998
(Continued)

OTHER PUBLICATIONS

An Office Action mailed by the German Patent and Trademark Office on Sep. 23, 2024, which corresponds to German Patent Application No. 10 2023 104 296.3 and is related to U.S. Appl. No. 18/150,662; with English translation.
(Continued)

*Primary Examiner* — Shahed Ahmed
(74) *Attorney, Agent, or Firm* — Studebaker Brackett PLLC

(57) ABSTRACT

An object is to provide a technique that improves the moisture uptake resistance of a semiconductor device. A semiconductor device includes a resin insulating sheet, a heat spreader provided on the resin insulating sheet, a semiconductor element mounted on the heat spreader, a lead frame having one end portion thereof connected to the semiconductor element, a first resin body that seals the resin insulating sheet, the heat spreader, the semiconductor element, and the one end portion of the lead frame with a rear surface of the resin insulating sheet being exposed, and a second resin body that seals the first resin body with the rear surface of the resin insulating sheet being exposed.

7 Claims, 4 Drawing Sheets

(51) Int. Cl.
*H01L 23/29* (2006.01)
*H01L 23/367* (2006.01)

(58) Field of Classification Search
CPC ............ H01L 23/4334; H01L 23/3135; H01L 23/3735; H01L 23/3107; H01L 23/49575; H01L 23/3121; H01L 23/28–3192; H01L 21/56–568; H01L 2924/181–186; H01L 23/40–4093; H01L 23/495–49596
See application file for complete search history.

(56) References Cited

U.S. PATENT DOCUMENTS

| | | | |
|---|---|---|---|
| 2014/0138707 | A1 | 5/2014 | Miki et al. |
| 2019/0273030 | A1* | 9/2019 | Lim .................... H01L 23/3675 |

FOREIGN PATENT DOCUMENTS

| | | | |
|---|---|---|---|
| JP | 2000-183281 A | | 6/2000 |
| JP | 2002-314035 A | | 10/2002 |
| JP | 2003-282613 A | | 10/2003 |
| JP | 2011-014863 A | | 1/2011 |
| JP | 2012209470 A | * | 10/2012 |
| JP | 2014-120619 A | | 6/2014 |
| JP | 2014-179376 A | | 9/2014 |
| JP | 2015-130457 A | | 7/2015 |

OTHER PUBLICATIONS

An Office Action mailed by the Japanese Patent Office on Jan. 7, 2025, which corresponds to Japanese Patent Application No. 2022-062232 and is related to U.S. Appl. No. 18/150,662; with English language Translation.

An Office Action mailed by the Japanese Patent Office on Apr. 15, 2025, which corresponds to Japanese Patent Application No. 2022-062232 and is related to U.S. Appl. No. 18/150,662; with English language translation.

* cited by examiner

SEMICONDUCTOR DEVICE AND METHOD OF MANUFACTURING SEMICONDUCTOR DEVICE

FIELD OF THE INVENTION

The present disclosure relates to a semiconductor device and a method of manufacturing the semiconductor device.

DESCRIPTION OF THE BACKGROUND ART

A semiconductor device having a plurality of resin layers has been proposed in order to improve the reliability of the semiconductor device. For example, Japanese Patent Application Laid-Open No. 2000-183281 discloses a structure of a semiconductor device that is double-sealed with a plurality of resin layers, and a method of manufacturing the semiconductor device.

However, in the technique described in Japanese Patent Application Laid-Open No. 2000-183281, a first resin layer constitutes the upper surface of the semiconductor device. That is, the upper side of the semiconductor element is sealed only with the first resin layer. Accordingly, the upper side of the semiconductor element is not double-sealed; therefore, moisture in the air may enter the inside of the first resin layer in some cases.

SUMMARY

An object of the present disclosure is to provide a technique that improves the moisture uptake resistance of a semiconductor device.

A semiconductor device according to the present disclosure includes an insulating sheet, a heat spreader, a semiconductor element, a lead frame, a first resin body, and a second resin body. The heat spreader provided on the insulating sheet. The semiconductor element is mounted on heat spreader. The lead frame has one end portion thereof connected to the semiconductor element. The first resin body seals the insulating sheet, the heat spreader, the semiconductor element, and the one end portion of the lead frame with a rear surface of the insulating sheet being exposed. The second resin body seals the first resin body with the rear surface of the insulating sheet being exposed.

The semiconductor element is sealed with the first resin body, and the first resin body is sealed with the second resin body; therefore, the first resin body is tightly sealed. Consequently, the moisture uptake resistance of the semiconductor device is improved.

These and other objects, features, aspects and advantages of the present disclosure will become more apparent from the following detailed description of the present disclosure when taken in conjunction with the accompanying drawings.

DESCRIPTION OF THE PREFERRED EMBODIMENTS

First Embodiment

<Configuration of Semiconductor Device>

Figure 1:
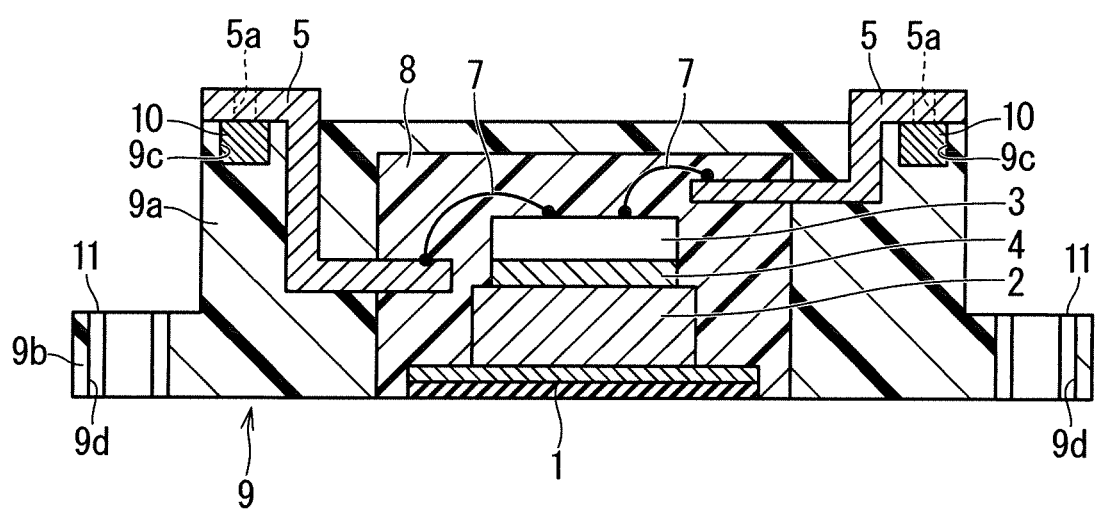
FIG. 1 is a cross-sectional view of a semiconductor device according to a first embodiment.

A first embodiment will be described below with reference to the drawings. FIG. 1 is a cross-sectional view of a semiconductor device according to the first embodiment.

As illustrated in FIG. 1, a resin insulating sheet 1, a heat spreader 2, a semiconductor element 3, a plurality of lead frames 5, a first resin body 8, and a second resin body 9 are provided.

The resin insulating sheet 1 is a resin insulating sheet with metal foil (for example, copper foil) formed on an insulating sheet. The insulating sheet is composed of an epoxy resin containing BN filler as the main material thereof, for example. The resin insulation sheet 1 may be a resin insulation sheet with thick copper.

The heat spreader 2 is composed of copper as the main material thereof, for example, and is provided on the resin insulating sheet 1. The semiconductor element 3 is a power semiconductor element including an Insulated Gate Bipolar Transistor (IGBT) or a diode. The semiconductor element 3 is mounted on the heat spreader 2 via solder 4. The number of semiconductor elements 3 is not limited to one, and may be plural.

Each of the lead frames 5 is composed of copper as the main material thereof, for example, and has one end portion to be connected to a front surface electrode (not illustrated) of the semiconductor element 3 by a bonding wire 7. The bonding wires 7 are aluminum wires or copper wires, for example. The bonding wires 7 may be ball bonding wires such as gold wires or silver wires.

The first resin body 8 is composed of a thermosetting resin such as an epoxy resin as the main material thereof. The first resin body 8, which is formed, for example, in the shape of a rectangular parallelepiped, seals the resin insulating sheet 1, the heat spreader 2, semiconductor element 3, and one end portions of the plurality of lead frames 5, with the rear surface of the resin insulating sheet 1 being exposed.

The second resin body 9 is composed of a thermoplastic resin such as Poly Phenylene Sulfide (PPS), Poly Butylene Terephthalate (PBT), Acrylonitrile Butadiene Styrene (ABS), and Polycarbonate (PC) as the main material thereof. The second resin body 9 includes a main body portion 9a and a collar portion 9b protruding outward from the entire outer peripheral portion of the main body portion 9a. The main body portion 9a is formed, for example, in a rectangular parallelepiped shape, and seals the first resin body 8 with the rear surface of the resin insulating sheet 1 exposed. The first resin body 8 is tightly sealed by the second resin body 9; therefore, moisture is prevented from entering the first resin body 8 from the outside. Consequently, the moisture uptake resistance of the semiconductor device is improved.

The plurality of lead frames 5 are insert molded into the main body portion 9a in an integral manner. One end portions of the plurality of lead frames 5 extend inside the first resin body 8, and the other end portions of the plurality of lead frames 5 are exposed to the outside from the upper end surface (front surface) of the main body portion 9a. The other end portion of each lead frame 5 is provided with a screw hole 5a through which a screw (not illustrated) is inserted for fixing to an external device (not illustrated). A nut box 9c that accommodates a nut 10 for fixing a screw inserted through the screw hole 5a is provided at a portion of the second resin body 9 that faces the screw hole 5a.

The collar portion 9b is provided with a plurality of mounting holes 9d (for example, two) that accommodate bushes 11 to which a heat sink (not illustrated) can be mounted, for example.

The other end portion of each lead frame 5 may be connected to an external device by soldering. In that case, connection to the external device is ensured without each lead frame 5 provided with a screw hole 5a, and the nuts 10 and the nut boxes 9c provided in the second resin body 9 being provided.

Also, the first resin body 8 is desirably composed of a resin material harder than the second resin body 9 as the material thereof. Improvement in the reliability such as improving the power cycle tolerance of the semiconductor device can be expected with the first resin body 8, which is in contact with the semiconductor element 3, being hard. Further, when fastened to the heat sink via the bushes 11, the second resin body 9 being soft relaxes the stress applied to the second resin body 9; therefore, suppression of cracks occurring in the second resin body 9 can be expected.

Further, the linear thermal expansion coefficients are desirably approximate among the first resin body 8, the second resin body 9, the resin insulating sheet 1, the heat spreader 2, the plurality of lead frames 5, and the bonding wires 7. With this, the improvement in the reliability such as improving the power cycle tolerance of the semiconductor device can be expected. When the linear thermal expansion coefficients of the first resin body 8 and the bonding wires 7 are particularly approximate, the thermal stress applied to the bonding wires 7 due to heat generation and cooling during driving of the semiconductor element 3 can be relaxed, and the improvement in the power cycle tolerance can be expected.

<Method of Manufacturing Semiconductor Device>

Figure 2:
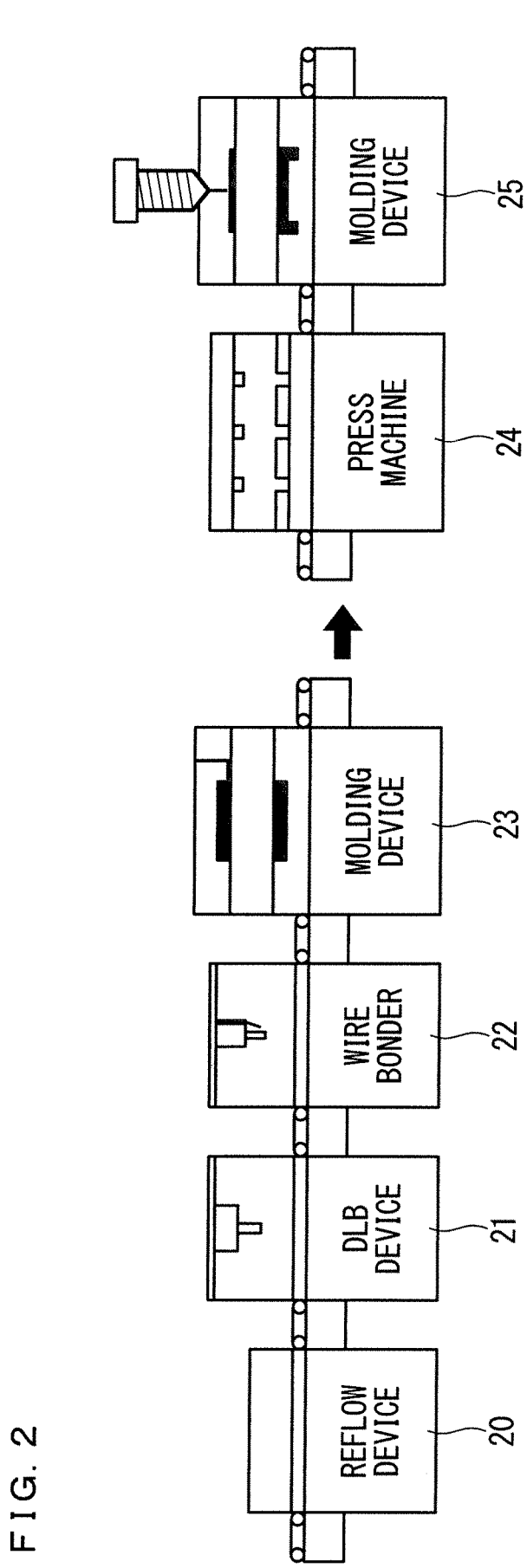
FIG. 2 is an explanatory diagram for illustrating a method of manufacturing the semiconductor device according to the first embodiment.
Figure 3:
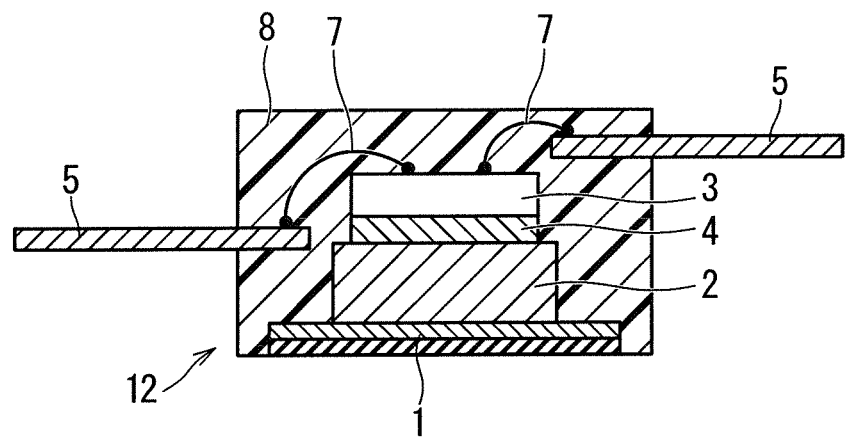
FIG. 3 is a cross-sectional view of a module being a configuration in a process of manufacturing the semiconductor device according to the first embodiment.

Next, a method of manufacturing the semiconductor device will be described. FIG. 2 is an explanatory diagram for illustrating the method of manufacturing the semiconductor device according to the first embodiment. FIG. 3 is a cross-sectional view of a module 12 being a configuration in a process of manufacturing the semiconductor device according to the first embodiment.

As illustrated in FIG. 2, after the heat spreader 2 is fixed on the resin insulating sheet 1, soldering is performed where paste solder is applied on the heat spreader 2 in a reflow device 20, and the semiconductor element 3 is mounted thereon and is subjected to heating. Next, a wire bonder 22 connects the bonding wire 7 between each lead frame 5 and the semiconductor element 3. Note that a DLB device 21 is employed when connecting the lead frames 5 and the semiconductor element 3 by a direct lead bonding method, as in a second embodiment described later.

Next, in a molding device 23, primary molding, through which the module 12 illustrated in FIG. 3 is formed, is performed as follows: the resin insulating sheet 1, the heat spreader 2, the semiconductor element 3, and one end portions of the plurality of lead frames 5 are sealed with the first resin body 8 with the rear surface of the resin insulating sheet 1 being exposed.

Next, in a press machine 24, excess portions of the plurality of lead frames 5 on the other end side are cut, the lead frames 5 on the other end side are bent, and then excess portions of the first resin body 8 are removed.

Next, in a molding device 25, secondary molding, through which the module 12 is sealed with the second resin body 9 with the rear surface of the resin insulating sheet 1 being exposed, is performed, thereby completing the semiconductor device illustrated in FIG. 1. It should be noted that in the molding device 23, a manufacturing method in which a plurality of modules 12 are concurrently formed may be adoptable.

<Effect>

According to the first embodiment, the semiconductor device includes the resin insulating sheet 1, the heat spreader 2 provided on the resin insulating sheet 1, the semiconductor element 3 mounted on the heat spreader 2, the plurality of lead frames 5 each having one end portion connected to the semiconductor element 3, the first resin body 8 that seals the resin insulating sheet 1, the heat spreader 2, the semiconductor element 3, and one end portions of the plurality of lead frames 5 with the rear surface of the resin insulating sheet 1 being exposed, and the second resin body 9 that seals the first resin body 8 with the rear surface of the resin insulating sheet 1 being exposed.

The semiconductor element 3 is sealed with the first resin body 8, and the first resin body 8 is sealed with the second resin body 9; therefore, the first resin body 8 is tightly sealed. Consequently, the moisture uptake resistance of the semiconductor device is improved.

Further, the other end portion of each lead frames 5 are exposed from the front surface of the second resin body 9, the screw hole 5a is provided at the other end portion of each lead frame 5, and a nut box 9c that accommodates a nut 10 for fixing a screw inserted through the screw hole 5a is provided at a portion of the second resin body 9 that faces the screw hole 5a.

Therefore, the connection between the semiconductor device and the external device is ensured by fastening with screws, and this ensures the steadfast connection therebetween; therefore, the improvement in the reliability of the semiconductor device can be expected.

Also, the first resin body 8 contains a resin material harder than the second resin body 9. Improvement in the reliability such as improving the power cycle tolerance of the semiconductor device can be expected with the first resin body 8, which is in contact with the semiconductor element 3, being hard. Further, when fastened to the heat sink via the bushes 11, the second resin body 9 being soft relaxes the stress applied to the second resin body 9; therefore, suppression of cracks occurring in the second resin body 9 can be expected.

Further, the semiconductor device further includes bonding wires 7 connecting the semiconductor element 3 and the lead frames 5, and linear thermal expansion coefficients of at least two of the bonding wires 7, the first resin body 8, the second resin body 9, the resin insulating sheet 1, the heat spreader 2, and the lead frames 5 are close to each other; therefore the improvement in the power cycle tolerance in the semiconductor device can be expected. When the linear thermal expansion coefficients of the first resin body 8 and the bonding wires 7 are particularly approximate, the thermal stress applied to the bonding wires 7 due to heat generation and cooling during driving of the semiconductor element 3 can be relaxed, and the improvement in the power cycle tolerance can be expected.

Further, the method of manufacturing the semiconductor device according to the first embodiment includes the steps of (a) forming the module 12 by sealing the resin insulating sheet 1, the heat spreader 2, the semiconductor element 3, and one end portions of the plurality of lead frames 5 by the first resin body 8, with the rear surface of the resin insulating sheet 1 being exposed, (b) cutting the excess portions of the plurality of lead frames 5 on the other end side, bending the lead frames 5 on the other end side, and then removing the excess portions of the first resin body 8 in the module 12, and (c) sealing the module 12 by the second resin body 9 with the rear surface of the resin insulating sheet 1 being exposed.

Therefore, by performing lead cutting, lead venting, and excess resin removal in a mold different from that of the primary molding before the secondary molding is performed, the manufacturing efficiency of the semiconductor device is improved compared to performing these separately outside the mold.

Moreover, a plurality of modules 12 are formed in the step (a); therefore, the manufacturing efficiency of the semiconductor device is improved as compared to the case where the modules 12 are formed one by one.

Second Embodiment

Figure 4:
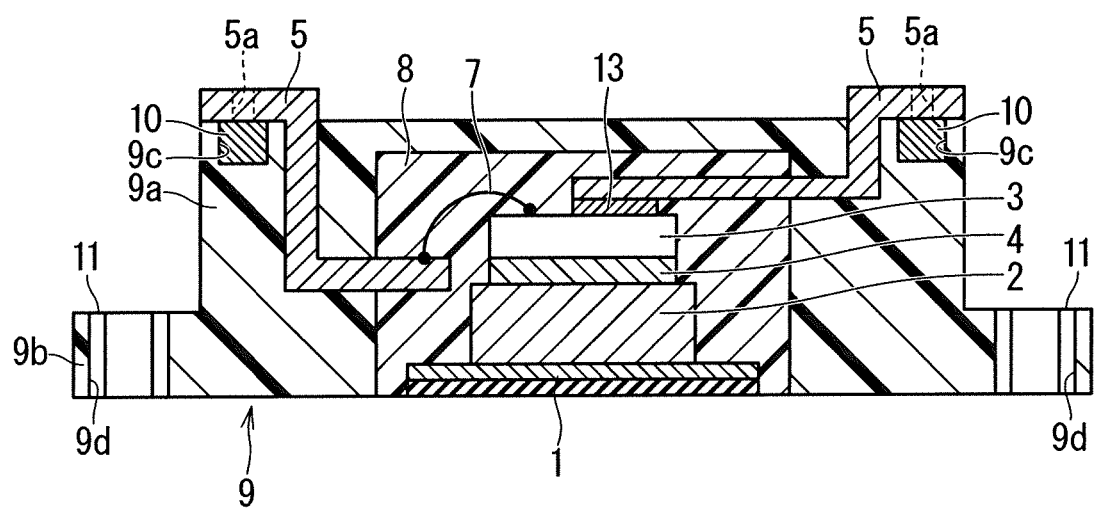
FIG. 4 is a cross-sectional view of a semiconductor device according to a second embodiment.

Next, a semiconductor device according to a second embodiment will be described. FIG. 4 is a cross-sectional view of a semiconductor device according to the second embodiment. It should be noted that, in the second embodiment, the same components as those described in the first embodiment are denoted by the same reference numerals, and the description thereof is omitted.

While in the first embodiment, one end portions of the plurality of lead frames 5 are connected to the semiconductor element 3 by the bonding wires 7, in the second embodiment, as illustrated in FIG. 4, one end portions of the lead frames 5 are connected to the front surface electrode of element 3 by a direct lead bonding method. Specifically, one end portions of the lead frames 5 on the right side in FIG. 4 and the front surface electrode of the semiconductor element 3 are connected by soldering, brazing, welding, or a conductive adhesive. Note, not only the lead frames 5 on the right side in FIG. 4, but also one end portions of the lead frames 5 on the left side may be connected by the direct lead bonding method.

As a result, more improvement in the reliability of the semiconductor device can be expected than that in the case of the first embodiment.

Third Embodiment

Figure 5A:
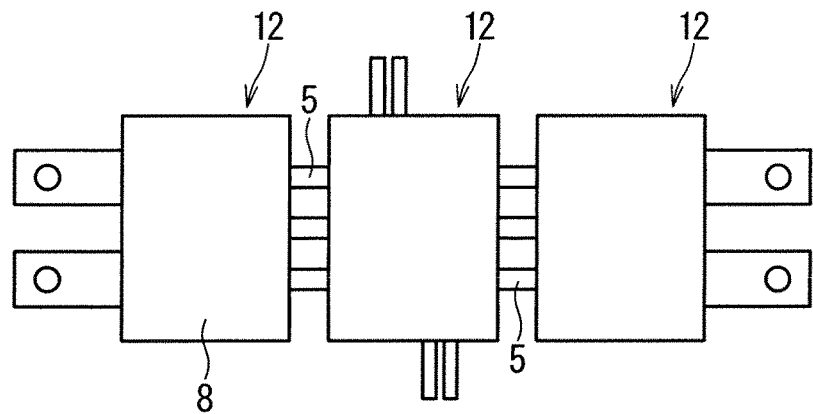
FIGS. 5A to 5C are top views illustrating examples of change in connection of semiconductor devices according to a third embodiment.
Figure 5B:
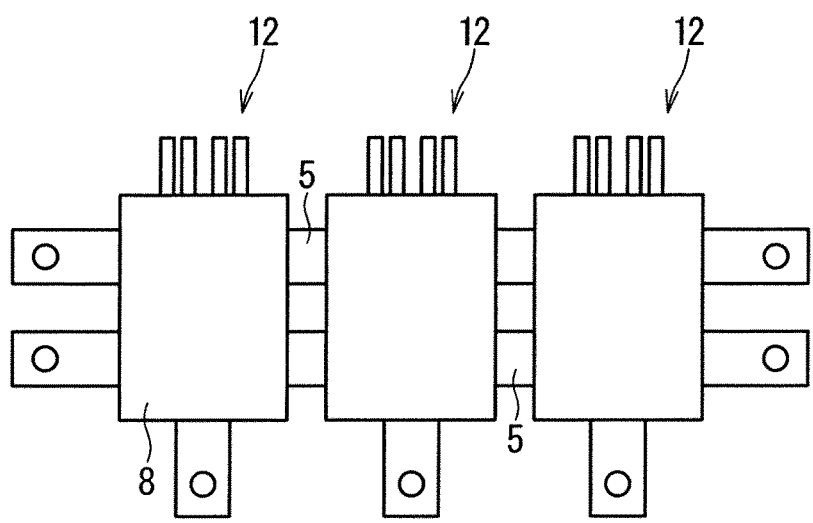
Figure 5C:
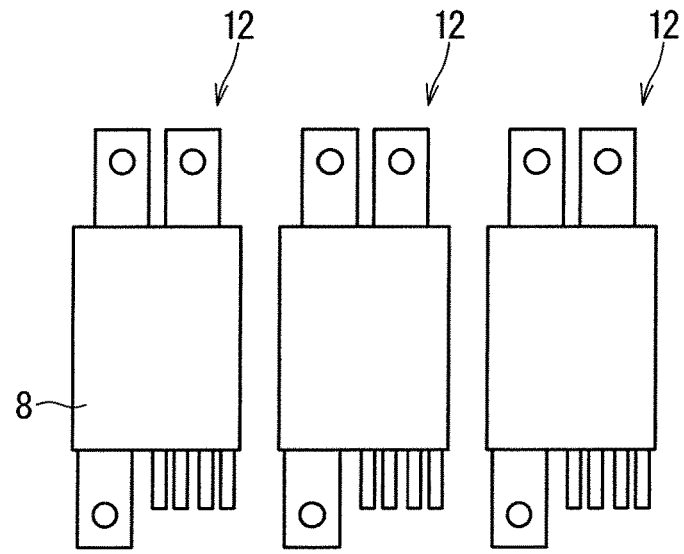

Next, a semiconductor device according to a third embodiment will be described. FIGS. 5A to 5C are top views illustrating examples of change in connection of semiconductor devices according to the third embodiment. FIG. 5A is an example of change in connection when 2in1 types are combined into one, and FIG. 5B is an example of change in connection when 6in1 types are combined into one. FIG. 5C is an example of change in connection when there are three 2in1 types. It should be noted that, in the third embodiment, the same components as those described in the first and second embodiments are denoted by the same reference numerals, and the description thereof is omitted.

As illustrated in FIGS. 5A, 5B, and 5C, a plurality of modules 12 that are primarily molded with the first resin body 8 are arranged, and each module 12 is connected by the lead frames 5. Although not illustrated, the secondary molding is then performed with the second resin body 9 composed of a thermoplastic resin as the main material thereof. The lead frames 5 may be connected to the semiconductor element 3 by bonding wires 7 as in the first embodiment, or may be connected to the semiconductor element 3 by a direct lead bonding method as in the second embodiment.

The thermoplastic resin contained in the second resin body 9 allows diverse shapes in the semiconductor device, and the improvement in the manufacturing efficiency of the semiconductor device can be expected.

The embodiments can be arbitrarily combined, appropriately modified or omitted.

Hereinafter, various aspects of the present disclosure will be collectively described as appendices.

Appendix 1

A semiconductor device includes
an insulating sheet,
a heat spreader provided on the insulating sheet,
a semiconductor element mounted on the heat spreader,
a lead frame having one end portion thereof connected to the semiconductor element,
a first resin body that seals the insulating sheet, the heat spreader, the semiconductor element, and the one end portion of the lead frame with a rear surface of the insulating sheet being exposed, and
a second resin body that seals the first resin body with the rear surface of the insulating sheet being exposed.

Appendix 2

The semiconductor device according to Appendix 1, wherein
an other end portion of the lead frame is exposed from a front surface of the second resin body,
a screw hole is provided in the other end portion of the lead frame, and
a nut box that accommodates a nut for fixing a screw inserted through the screw hole is provided at a portion of the second resin body that faces the screw hole.

Appendix 3

The semiconductor device according to Appendix 1, wherein the first resin body contains a resin material harder than the second resin body.

Appendix 4

The semiconductor device according to Appendix 1, further includes
a bonding wire that connects the semiconductor element and the one end portion of the lead frame, wherein
linear thermal expansion coefficients of at least two of the bonding wire, the first resin body, the second resin body, the insulating sheet, the heat spreader, and the lead frame are close to each other.

Appendix 5

The semiconductor device according to Appendix 4, wherein the linear thermal expansion coefficients of the bonding wire and the first resin body are close to each other.

Appendix 6

The semiconductor device according to Appendix 1, wherein the one end portion of the lead frame is connected to a front surface electrode of the semiconductor element by a direct lead bonding method.

Appendix 7

The semiconductor device according to Appendix 1, wherein
the second resin body contains a thermoplastic resin.

Appendix 8

A method of manufacturing the semiconductor device according to Appendix 1, includes the steps of
(a) forming a module by sealing the insulating sheet, the heat spreader, the semiconductor element, and the one end portion of the lead frame by the first resin body, with the rear surface of the insulating sheet being exposed,
(b) cutting an excess portion of the lead frame on the other end side, bending the lead frame on the other end side, and then removing an excess portion of the first resin body in the module, and
(c) sealing the module by the second resin body with the rear surface of the insulating sheet being exposed.

Appendix 9

The method of manufacturing the semiconductor device according to Appendix 8, wherein
a plurality of the modules are formed in the step (a).

While the disclosure has been illustrated and described in detail, the foregoing description is in all aspects illustrative and not restrictive. It is therefore understood that numerous modifications and variations can be devised without departing from the scope of the invention.

What is claimed is:

1. A semiconductor device comprising:
an insulating sheet;
a heat spreader provided on the insulating sheet;
a semiconductor element mounted on the heat spreader;
a lead frame having one end portion thereof connected to the semiconductor element;
a first resin body that seals the insulating sheet, the heat spreader, the semiconductor element, and the one end portion of the lead frame with a rear surface of the insulating sheet being exposed;
a second resin body that seals the first resin body with the rear surface of the insulating sheet being exposed; and
a bonding wire that connects the semiconductor element and the one end portion of the lead frame, the bonding wire being entirely disposed within the first resin body.

2. The semiconductor device according to claim 1, wherein
an other end portion of the lead frame is exposed from a front surface of the second resin body,
a screw hole is provided in the other end portion of the lead frame, and
a nut box that accommodates a nut for fixing a screw inserted through the screw hole is provided at a portion of the second resin body that faces the screw hole.

3. The semiconductor device according to claim 1, wherein
the first resin body contains a resin material harder than the second resin body.

4. The semiconductor device according to claim 1, further comprising another lead frame having one end portion thereof connected to the semiconductor element, wherein
the one end portion of the another lead frame is connected to a front surface electrode of the semiconductor element by a direct lead bonding method.

5. The semiconductor device according to claim 1, wherein
the second resin body contains a thermoplastic resin.

6. A method of manufacturing the semiconductor device according to claim 1, comprising the steps of:
(a) forming a module by sealing the insulating sheet, the heat spreader, the semiconductor element, and the one end portion of the lead frame by the first resin body, with the rear surface of the insulating sheet being exposed;
(b) cutting an excess portion of the lead frame on the other end side, bending the lead frame on the other end side, and then removing an excess portion of the first resin body in the module; and
(c) sealing the module by the second resin body with the rear surface of the insulating sheet being exposed.

7. The method of manufacturing the semiconductor device according to claim 6, wherein
a plurality of the modules are formed in the step (a).

* * * * *